United States Patent
Gallagher et al.

(10) Patent No.: US 9,478,708 B2
(45) Date of Patent: Oct. 25, 2016

(54) EMBEDDED GALLIUM—NITRIDE IN SILICON

(71) Applicant: International Business Machines Corporation, Armonk, NY (US)

(72) Inventors: William J. Gallagher, Ardsley, NY (US); Effendi Leobandung, Stormville, NY (US); Devendra K. Sadana, Pleasantville, NY (US); Ghavam G. Shahidi, Pound Ridge, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/644,393

(22) Filed: Mar. 11, 2015

(65) Prior Publication Data

US 2016/0268475 A1 Sep. 15, 2016

(51) Int. Cl.
| | |
|---|---|
| H01L 21/00 | (2006.01) |
| H01L 33/32 | (2010.01) |
| H01L 21/762 | (2006.01) |
| H01L 21/02 | (2006.01) |
| H01L 21/3065 | (2006.01) |
| H01L 21/311 | (2006.01) |
| H01L 33/00 | (2010.01) |

(52) U.S. Cl.
CPC ........... H01L 33/32 (2013.01); H01L 21/0254 (2013.01); H01L 21/02381 (2013.01); H01L 21/3065 (2013.01); H01L 21/31116 (2013.01); H01L 21/76283 (2013.01); H01L 33/007 (2013.01); H01L 33/0025 (2013.01)

(58) Field of Classification Search
CPC ............. H01L 33/32; H01L 21/02381; H01L 21/0254; H01L 21/3065; H01L 21/31116; H01L 21/76283; H01L 33/0025; H01L 33/007
USPC ............................ 438/47, 42, 424, 429, 44
See application file for complete search history.

(56) References Cited

U.S. PATENT DOCUMENTS

| | | | |
|---|---|---|---|
| 7,420,226 B2 | 9/2008 | Augustine et al. | |
| 7,615,470 B2 | 11/2009 | Kim et al. | |
| 7,781,356 B2 | 8/2010 | Kouvetakis et al. | |
| 8,138,510 B2 | 3/2012 | Tak et al. | |
| 8,242,510 B2 | 8/2012 | Hebert | |
| 8,476,125 B2 | 7/2013 | Khan et al. | |
| 8,507,947 B2 | 8/2013 | Ramdani et al. | |
| 8,536,629 B2 | 9/2013 | Tada et al. | |
| 9,048,303 B1 * | 6/2015 | Ostermaier et al. | ......... H01L 29/7783 |

FOREIGN PATENT DOCUMENTS

JP 2009117485 A 5/2009

* cited by examiner

*Primary Examiner* — Thien F Tran
(74) *Attorney, Agent, or Firm* — Louis J. Percello; Erik K. Johnson

(57) ABSTRACT

A method and structure for integrating gallium nitride into a semiconductor substrate. The method may also include means for isolating the gallium nitride from the semiconductor substrate.

12 Claims, 3 Drawing Sheets

EMBEDDED GALLIUM—NITRIDE IN SILICON

BACKGROUND

The present invention relates to semiconductor device, specifically to integrating semiconductor and GaN structures on the same device.

Gallium nitride (GaN) is a binary III/V direct bandgap semiconductor commonly used in bright light-emitting diodes. Its wide band gap of 3.4 eV affords it special properties for applications in optoelectronic, high-power and high-frequency devices. For example, GaN is the substrate which makes violet (405 nm) laser diodes possible, without use of nonlinear optical frequency-doubling. Its sensitivity to ionizing radiation is low, making it a suitable material for solar cell arrays.

BRIEF SUMMARY

An embodiment of the invention may include a method of forming a semiconductor structure. The method may include depositing a nitride layer on a semiconductor substrate. The method then forms a trench through the nitride layer and into the semiconductor substrate. The method then forms a gallium-nitride layer in the trench and above the semiconductor substrate and the nitride layer. The method then forms a photoresist layer over a portion of the trench, wherein a covered portion of the gallium nitride layer is located below the photoresist layer, and wherein an uncovered portion of the gallium-nitride layer is located at least in the trench. The method then removes the uncovered portion of the gallium-nitride layer and the photoresist layer. Next, the method deposits an insulating layer between the covered portion of the gallium-nitride layer and the semiconductor substrate, wherein a portion of the insulating layer is located above the gallium nitride layer.

Another embodiment may include a semiconductor structure. The semiconductor structure may include a substrate, where a trench is located in the substrate, and the substrate contains silicon. There may be a gallium-nitride layer located in the trench. The top surface of the gallium-nitride layer may be coplanar with a top surface of the substrate. A semiconductor structure may be located on the substrate. And a GaN structure located above the gallium nitride layer.

Another embodiment may include a semiconductor structure. The semiconductor structure may include a substrate, where a trench is located in the substrate, and the substrate contains silicon. There may be a gallium-nitride layer located in the trench. Additionally, there may be an aluminum-gallium-nitride layer located on the gallium nitride layer. The top surface of the aluminum-gallium-nitride layer may be coplanar with a top surface of the substrate. A semiconductor structure may be located on the substrate. And a GaN structure located above the gallium nitride layer.

BRIEF DESCRIPTION OF THE SEVERAL DRAWINGS

Figure 1:
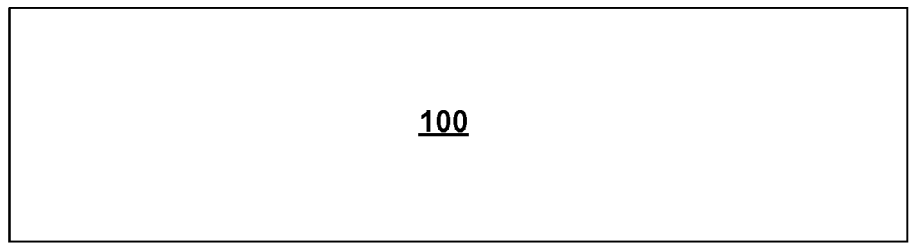
FIG. 1 is a cross-sectional view of a substrate, according to an example embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Gallium Nitride (GaN) may be a useful material to create LED and solar power devices. As technology progresses, the inclusion of such devices into a semiconductor chip may allow for more efficient systems, by helping to maintain voltage between semiconductor and GaN based devices and reducing the distances between such devices. By integrating both materials into a single chip, GaN and semiconductor devices may be developed (possibly in parallel) on a single substrate in order to achieve more efficient overall performance.

Referring to FIG. 1, a substrate 100 may be provided. In some embodiments, the substrate 100 may be either a bulk substrate or a semiconductor on insulator (SOI) substrate. The substrate 100 may be made of any semiconductor material typically known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. In a preferred embodiment, the semiconductor material may be silicon, germanium, silicon-germanium, silicon carbide, or alloys thereof. In embodiments where the substrate 100 is an SOI substrate, a base semiconductor substrate may be separated from a top semiconductor layer by a buried insulator layer (not shown). In such embodiments, the top semiconductor layer and the base semiconductor substrate may be made of the same materials as the bulk substrate discussed above. The buried insulator layer may have a thickness ranging from approximately 100 to approximately 500 nm, preferably about 200 nm.

Figure 2:
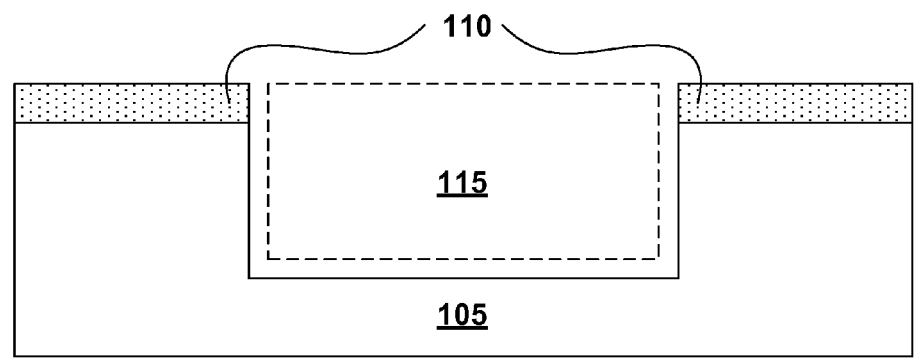
FIG. 2 is a cross-sectional view of a substrate following deposition of a nitride and etching a trench, according to an example embodiment.

Referring to FIG. 2, a nitride layer 110 may be deposited above the substrate 100, and trench 115 may be formed in the substrate. The nitride layer 110 is intended to protect the substrate 100 during etching and the subsequent epitaxial growth. The nitride layer 110 may be made from any of several known nitrides or oxides such as, for example, silicon nitride. In such embodiments, the nitride layer 110 may have any thickness capable of protecting the substrate 100, for example thickness ranging from, but not limited to, approximately 10 nm to approximately 400 nm. Deposition of the nitride layer 110 may be performed by any suitable deposition technique known in the art, including atomic layer deposition (ALD), chemical vapor deposition (CVD), physical vapor deposition (PVD), molecular beam deposition (MBD), pulsed laser deposition (PLD), or liquid source misted chemical deposition (LSMCD).

Still referring to FIG. 2, a trench 115 may be formed in the substrate 100 and the nitride layer 110 through lithographic patterning and etching, leaving an etched substrate 105. The trench 115 may be created to provide a space to deposit gallium nitride in order to create a space on a device for LED or laser emitting structures. The trench 115 may be formed using a photolithography process followed by an anisotropic etching process such as reactive ion etching (RIE) or plasma etching. The trench 115 may have a depth of lto 10 um, and a width to 0.1 to 10 um, although larger or smaller dimensions may be contemplated.

Figure 3:
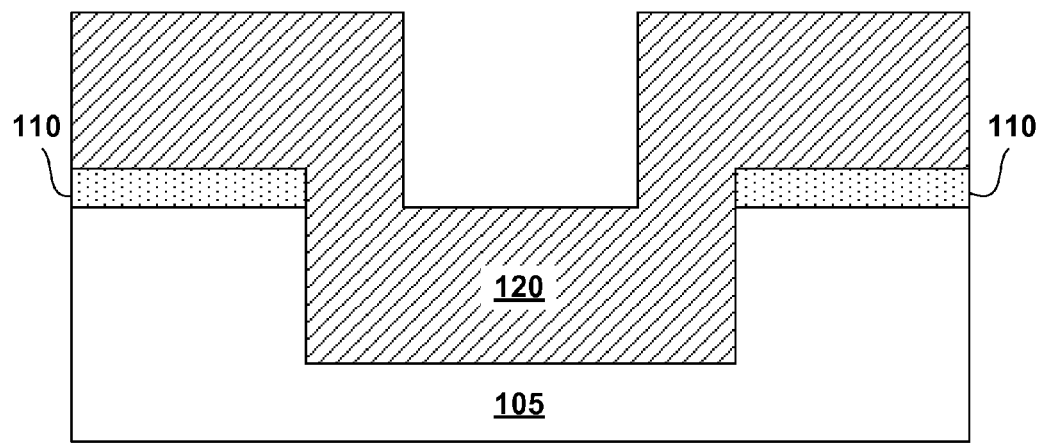
FIG. 3 is a cross-sectional view of a substrate following deposition of a Gallium-Nitride layer, according to an example embodiment.

Referring to FIG. 3, a Gallium-Nitride layer 120 may be epitaxially grown in the trench 115. In an embodiment, the mole % of each constituent molecule in the Gallium-Nitride layer 120 may be, for example, approximately 30% to approximately 70% gallium and approximately 30% to approximately 70% nitrogen with preferred embodiment at 50% Galium and 50% Nitrogen. In other embodiments, an Aluminum-Gallium-Nitride layer may be located above the Gallium-Nitride layer 120. In such embodiments, the mole % of each constituent the Gallium-Nitride layer 120 may be, for example, approximately 10% to approximately 50% gallium, approximately 30% to approximately 50% nitrogen and approximately 10 to approximately 50% aluminum. The Gallium-Nitride layer 120 may be epitaxially grown on the existing crystal lattice of the recessed substrate 105 in the trench 115.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Figure 4:
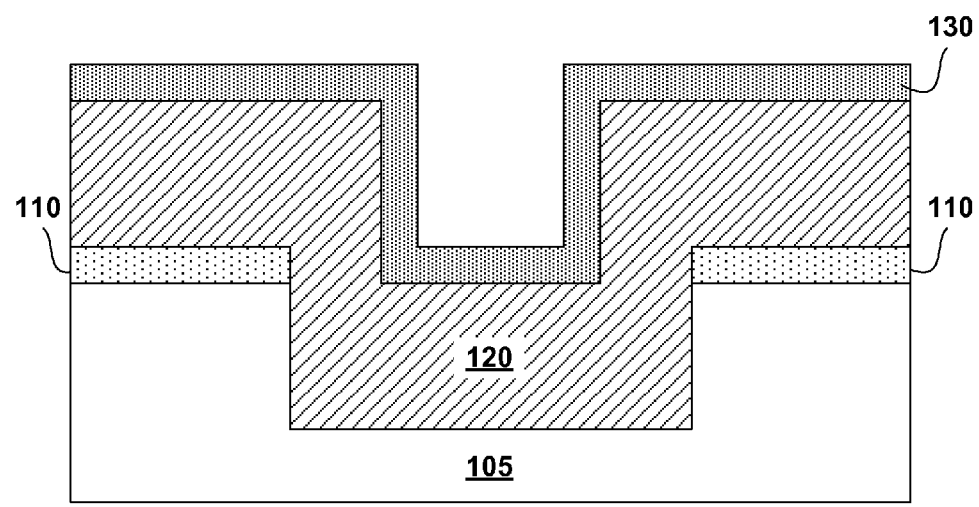
FIG. 4 is a cross-sectional view of a substrate following deposition of a masking layer, according to an example embodiment.

Referring to FIG. 4, a masking layer 130 may be deposited on the Gallium-Nitride layer 120. The masking layer 130 may allow selective etching of the Gallium-Nitride layer 120. The masking layer 130 may include any suitable oxide masking material such as, for example, silicon oxide. The masking layer 130 may be formed by any suitable deposition technique or techniques known in the art, including, for example, ALD, CVD, PVD, MBD, PLD, and LSMCD.

Figure 5:
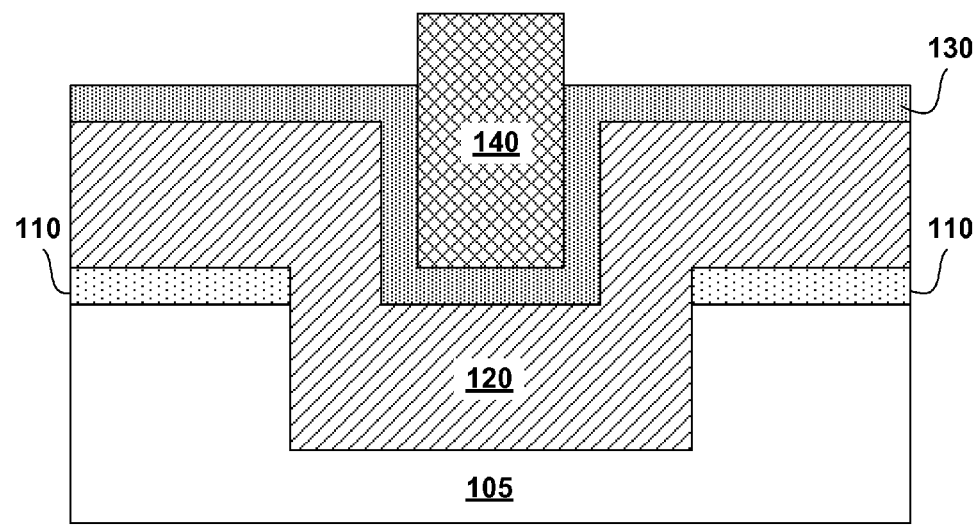
FIG. 5 is a cross-sectional view of a substrate following deposition and patterning of a lithographic layer, according to an example embodiment.

Referring to FIG. 5, a photoresist layer may be deposited and patterned, using known lithographic patterning techniques, to create a photoresist column 140. The photoresist column 140 may allow for removal of the gallium-nitride layer 120 and the masking layer 130 in the unwanted regions.

Figure 6:
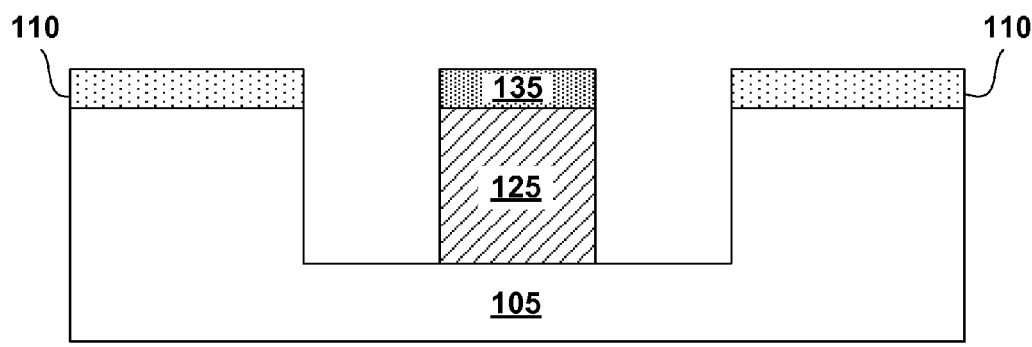
FIG. 6 is a cross-sectional view of a substrate following etching of the masking layer and the Gallium-Nitride layer, according to an example embodiment.

Referring to FIG. 6 an anisotropic etch may be performed remove the uncovered gallium-nitride layer 120 and masking layer 130, leaving a gallium-nitride insert 125 and a hardmask cap 135. More specifically, a pattern defined by the photoresist column 140 may be transferred into the gallium-nitride layer 120 and the masking layer 130. The etch may be performed using a single etch, or multiple etches. In embodiments using multiple etches, each etchant may be selected to selectively remove the undesired exposed layers, while maintaining the desired exposed layers.

Figure 7:
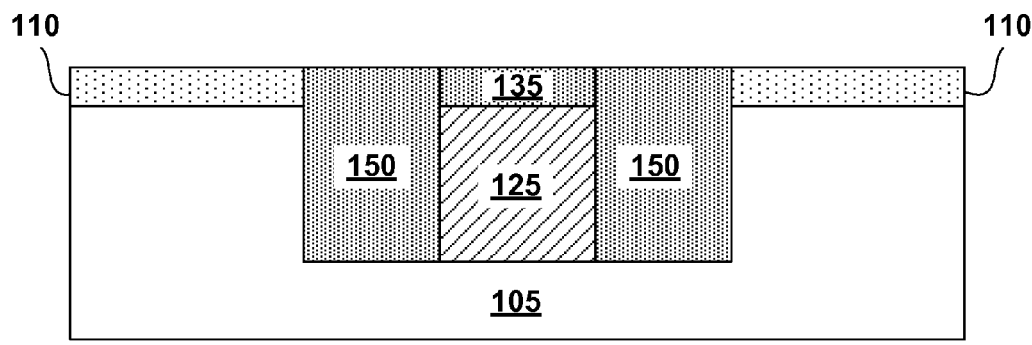
FIG. 7 is a cross-sectional view of a substrate following deposition and planarization of an insulating layer, according to an example embodiment.

Referring to FIG. 7, an interlevel dielectric (ILD) layer may be deposited, and planarized, to isolate the etched substrate 115 from the gallium-nitride insert 125. The ILD layer 150 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics and may be formed using any suitable deposition techniques including ALD, CVD, plasma enhanced CVD, spin on deposition, or PVD. After deposition, the ILD layer 150 may be planarized, using, for example, chemical-mechanical planarization (CMP) to remove excess material and expose the surface of the etched substrate 115.

Following the deposition and deposition of the ILD layer, a structure may exist where a gallium-nitride region is embedded in a semiconductor substrate. The substrate may either be a bulk substrate or a SOI substrate. In additional embodiments, an aluminum-gallium-nitride layer is located above the gallium nitride region. The gallium-nitride region may have a bottom surface located directly on the bulk substrate (in either bulk substrate or SOI), while the vertical surfaces of the substrate and gallium-nitride region are separated by an insulating layer. Additionally, a top surface of the gallium-nitride region, or aluminum-gallium-nitride layer, may be coplanar with the top surface of the substrate. Following the creation of the gallium nitride region, the nitride and oxide regions covering the structure may be removed and semiconductor structures, such as, for example, gates, EDRAM, SRAM, fuses, etc., may be created on the semiconductor substrate. Additionally GaN structures, such as LEDs, may be created on the gallium nitride region. The structures may be electrically connected, thereby creating a single structure that incorporates GaN and semiconductor structures, and reducing the overall voltage and increasing efficiency of the combined system.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a semiconductor structure, the method comprising:
    depositing a nitride layer on a semiconductor substrate;
    forming a trench through the nitride layer and into the semiconductor substrate;
    forming a gallium-nitride layer in the trench and above the semiconductor substrate and the nitride layer;
    forming a photoresist layer over a portion of the trench, wherein a covered portion of the gallium nitride layer is located below the photoresist layer, and wherein an uncovered portion of the gallium-nitride layer is located at least in the trench;
    removing the uncovered portion of the gallium-nitride layer and the photoresist layer;
    depositing an insulating layer between the covered portion of the gallium-nitride layer and the semiconductor substrate, wherein a portion of the insulating layer is located above the gallium nitride layer.

2. The method of claim 1, wherein the gallium-nitride layer comprises 30 to 70 mole % gallium and 30 to 70 mole % nitrogen.

3. The method of claim 1, further comprising forming an aluminum-gallium-nitride layer on the gallium nitride layer prior to formation of the photoresist layer.

4. The method of claim 3, wherein the aluminium-gallium-nitride layer comprises 10 to 50 mole % gallium, 30 to 50 mole % nitrogen, and 10 to 50 mole % aluminum.

5. The method of claim 1, further comprising removing the nitride layer above the semiconductor substrate and removing the portion of the insulating layer above the gallium nitride layer.

6. The method of claim 5, further comprising forming a semiconductor structure on the semiconductor substrate.

7. The method of claim 6, wherein the semiconductor structure comprises a fuse, EDRAM, SRAM, or a gate.

8. The method of claim 5, further comprising forming a GaN structure on the gallium-nitride layer.

9. The method of claim 8, wherein the GaN structure comprises an LED.

10. The method of claim 1, wherein the semiconductor substrate is a semiconductor on insulator substrate.

11. The method of claim 10, wherein forming the trench through the nitride layer and into the semiconductor substrate comprises etching through the insulator layer of the semiconductor on insulator substrate.

12. The method of claim 1, wherein forming a gallium-nitride layer in the trench and above the semiconductor substrate and the nitride layer comprises epitaxially growing the gallium-nitride layer in the trench and above the semiconductor substrate and the nitride layer.

* * * * *